(12) United States Patent
Hainz

(10) Patent No.: US 8,085,179 B2
(45) Date of Patent: Dec. 27, 2011

(54) ANALOG-TO-DIGITAL CONVERTER

(75) Inventor: Simon Hainz, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/714,459

(22) Filed: Feb. 27, 2010

(65) Prior Publication Data

US 2011/0210880 A1 Sep. 1, 2011

(51) Int. Cl.
*H03M 1/12* (2006.01)
(52) U.S. Cl. .......................................... 341/155; 341/156
(58) Field of Classification Search .................. 341/155, 341/156, 161
See application file for complete search history.

(56) References Cited

U.S. PATENT DOCUMENTS

| | | | | |
|---|---|---|---|---|
| 5,457,456 A | * | 10/1995 | Norsworthy | 341/61 |
| 5,659,315 A | * | 8/1997 | Mandl | 341/143 |
| 6,069,579 A | * | 5/2000 | Ito et al. | 341/156 |
| 6,340,943 B1 | * | 1/2002 | Chow et al. | 341/161 |
| 2008/0272951 A1 | | 11/2008 | Li Puma | |

* cited by examiner

*Primary Examiner* — Jean Jeanglaude
(74) *Attorney, Agent, or Firm* — SpryIP, LLC

(57) ABSTRACT

Various implementations relating to analog-to-digital converters are provided. A comparator of such a circuit is used for converting different analog input signals, while analog-to-digital conversion circuitry for these conversions is implemented at least partially separately. In other implementations, a comparator is used both for analog-to-digital conversion and for comparing an input signal to a constant or non-constant value.

22 Claims, 4 Drawing Sheets

ANALOG-TO-DIGITAL CONVERTER

FIELD OF THE INVENTION

The present application relates to analog-to-digital converters and related circuits, apparatuses and methods.

BACKGROUND

Analog-to-digital converters generally are devices for converting an analog input signal to a digital output signal. Several types of analog-to-digital converters exist, one of these being so-called tracking analog-to-digital converters (ADCs).

In such tracking ADCs, a digital output signal of the ADC is compared (for example by using a digital-to-analog converter) with an analog input signal, and depending on this comparison the digital output signal is modified. With such a tracking ADC, the digital output signal follows or "tracks" changes of the analog input signal, hence the name.

In some applications, more than one analog signal has to be converted to a digital signal. Providing an corresponding plurality of separate ADCs, for example tracking ADCs, consumes a corresponding amount of chip area. On the other hand, simply multiplexing input signals into a tracking ADC and demultiplexing the corresponding output signals may lead to the problem that, in case of significantly different input signals, the amount of time assigned to each input signal for processing is not sufficient to fully track the signal, leading to incorrect digital output signals.

Furthermore, in some applications tracking ADCs are implemented together with a comparator, for example a comparator arrangement to compare a signal with a constant amplitude level, for example a level of zero to detect a zero crossing, e.g. for the purpose of offset compensation. Also in this case, considerable chip area may be needed, and furthermore inherent offsets of the comparator or the tracking ADC may not always be compensatable in such arrangements.

DETAILED DESCRIPTION OF THE INVENTION

Figure 1:
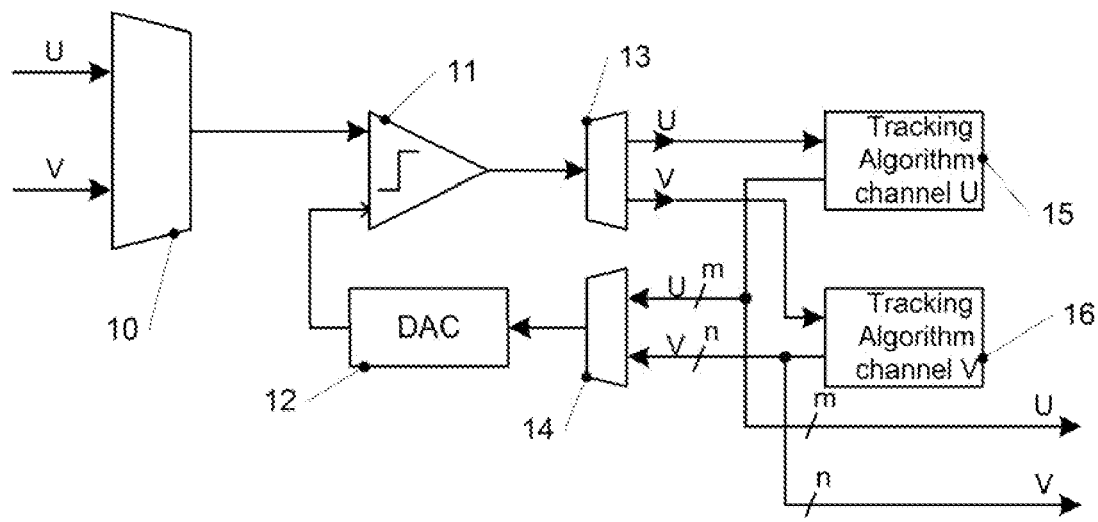
FIG. 1 shows a diagram of a tracking analog-to-digital converter arrangement according to an embodiment.

In the following, some embodiments of the present invention will be described in detail. It is to be understood that the following description is given only for the purpose of illustration and is not to be taken in a limiting sense. The scope of the invention is not intended to be limited by the embodiments described hereinafter with reference to the accompanying drawings, but is intended to be limited only by the appended claims and equivalents thereof.

It is also to be understood that in the following description of embodiments any direct connection or coupling between functional blocks, devices, components, circuit elements or other physical or functional units shown in the drawings or described herein could also be implemented by an indirect connection or coupling, i.e. a connection or coupling comprising one or more intervening elements. Furthermore, it should be appreciated that functional blocks or units shown in the drawings may be implemented as separate circuits in some embodiments, but may also be fully or partially implemented in a common circuit in other embodiments. In other words, the description of various functional blocks is intended to give a clear understanding of various functions performed in a device and is not to be construed as indicating that these functional blocks have to be implemented as separate physical units. For example, one or more functional blocks may be implemented by programming a processor like a single digital signal processor accordingly.

It is further to be understood that any connection which is described as being wire-based in the following specification may also be implemented as a wireless communication connection and vice versa unless noted to the contrary.

It should be noted that the drawings are provided to give an illustration of some aspects of embodiments of the present invention and therefore are to be regarded as schematic only. In particular, the elements shown in the drawings are not necessarily to scale with each other, and the placement of various elements of the drawings is chosen to provide a clear understanding of the respective embodiment and is not to be construed as necessarily being a representation of the actual relative location of the various components in implementations of embodiments of the invention.

The features of the various embodiments described herein may be combined with each other unless specifically noted otherwise. On the other hand, describing an embodiment with a plurality of features is not to be construed as indicating that all those features are necessary for practicing the present invention, as other embodiments may comprise less features and/or alternative features.

In the following, various embodiments relating to tracking analog-to-digital converters (ADCs) will be described. ADCs generally are devices converting an analog input signal to a digital output signal. Conversely, digital-to-analog converters (DACs) are devices for converting a digital input signal to an analog output signal.

In some of the embodiments described above, a comparator of a tracking ADC is used for receiving different input signals alternately, and/or for outputting its output signal to different entities alternately, for example for analog-to-digital conversion of different input signals in a quasi-parallel manner using the same comparator or for using a comparator both as a comparator to compare a signal with a constant or non-constant value and a comparator for analog-to-digital conversion. Such an alternating feeding of signals or outputting of signals may be realized using multiplexers. The term multiplexer as used herein is not limited to multiplexers implemented in hardware, but is intended to encompass e.g. multiplexing functions programmed in software by programming a processor accordingly. The same applies to demultiplexers.

Turning now to the Figures, in FIG. 1 a tracking ADC arrangement according to an embodiment is shown. The tracking ADC arrangement of FIG. 1 serves for quasi-parallel conversion of two analog input signals fed to a multiplexer 10 into two digital output signals. Quasi-parallel in this respect indicates that through switching between signals involved both digital output signals can be obtained with a time resolution determined by the switching.

In FIG. 1, signals relating to a first analog input signal and a corresponding first digital output signal or in other words a first signal path associated with the first input and output signals are generally labeled U, while signals relating to a second analog input signal and a corresponding second digital output signal or in other words a second signal path associated with the second input and output signals are generally labeled V.

In the embodiment of FIG. 1, the first analog input signal and the second analog input signal are fed to a first multiplexer 10. First multiplexer 10 alternately feeds the first analog input signal and the second analog input signal alternating with a predetermined switching frequency to a first input of a comparator 11. A second input of comparator 11 receives an analog output signal from a digital-to-analog converter 12. An output of comparator 11 is coupled with a demultiplexer 13 which in the embodiment of FIG. 1 may switch corresponding to the switching of first multiplexer 10 and feeds a comparison result relating to the first analog input signal to a first tracking algorithm channel 15 and outputs a comparison result relating to the second analog input signal to a second tracking algorithm channel 16. Tracking algorithm channel 15 outputs a digital output signal which may have a width of m bits both to an output and to a second multiplexer 14, and second tracking algorithm channel 16 outputs a digital output signal related to the second analog input signal also to an output and to second multiplexer 14. The second digital output signal may have a width of n bits, wherein n may be equal or unequal to m.

With a switching corresponding to the switching of first multiplexer 10 and demultiplexer 13, second multiplexer 14 alternately feeds the output signal from first tracking algorithm channel 15 and the output signal from second tracking algorithm channel 16 to digital-to-analog converter 12.

The function of the arrangement of FIG. 1 is as follows: When first multiplexer 10, demultiplexer 13 and second multiplexer 14 are switched to forward the signals corresponding to the first analog input signal, i.e. the signal path labeled U in FIG. 1 is active, comparator 11 compares the first analog input signal with an analog version (converted by DAC 12) of the first digital output signal. Depending on the comparison, first tracking algorithm channel 15 modifies the first digital output signal. For example, if the first analog input signal is greater than the digital version of the first digital output signal, the first digital output signal is increased, for example by a pre-determined step size, by first tracking algorithm channel 15. Conversely, if first multiplexer 10, demultiplexer 13 and second multiplexer 14 are switched to forward the signals associated with the second analog input signal or, in other words, the signal path labeled V is active, comparator 11 compares the second analog input signal with a digital version of the second digital output signal, and second tracking algorithm channel 16 modifies the second digital output signal depending on the comparison. Therefore, first tracking algorithm channel 15 and second tracking algorithm channel 16 may be seen as portions of tracking circuitry for converting the first analog input signal and the second analog input signal to a digital output signal, wherein first tracking algorithm channel 15 is associated with the first input signal and tracking algorithm channel 16 is associated with the second analog input signal.

In the embodiment of FIG. 1, as a single comparator and a single DAC are used for converting the first analog input signal and the second analog input signal, the required chip area is reduced compared to an implementation of two separate tracking ADCs. On the other hand, through the use of separate tracking algorithm channels 15, 16 for the two signal paths, when the first analog input signal and the second analog input signal drift apart still both signals can be accurately tracked converted.

Figure 2:
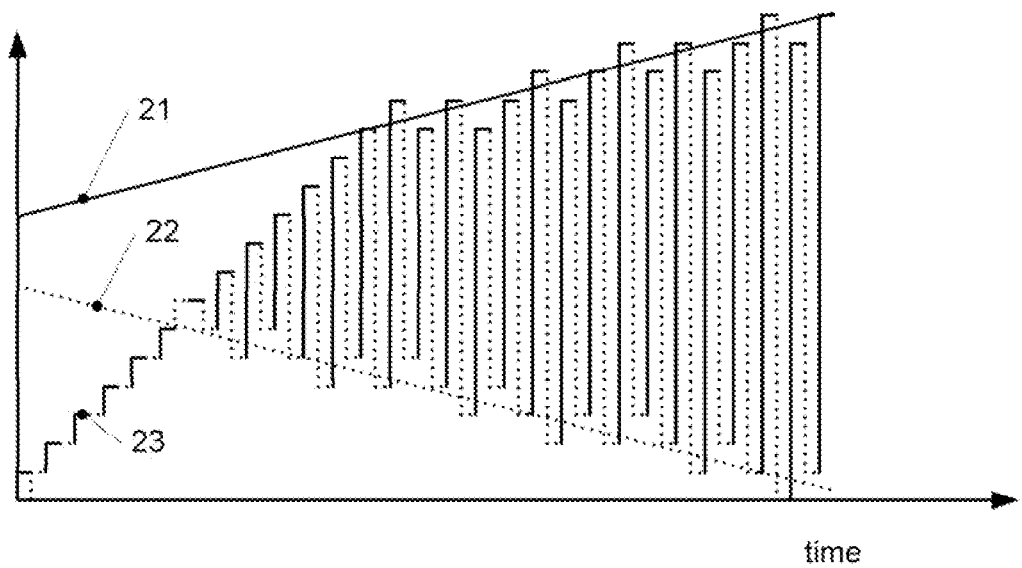
FIG. 2 shows examples for signals in the embodiment of FIG. 1.

To further illustrate the functioning of the embodiment of FIG. 1, in FIG. 2 examples for some signals involved are shown.

A solid curve 21 shows an example for a first analog input signal depending on time, and a dotted curve 22 shows an example for a second analog input signal depending on time. Solid portions of the curve 23 show the tracking of the first analog output signal, the horizontal portions thereof showing the corresponding digital output values, and dotted portions of curve 23 correspond to a tracking of a second analog input signal, horizontal portions again corresponding to the digital output values of the second digital output signal. As can be seen, once the correct values have been established, the signals are accurately tracked, and due to the use of separate tracking algorithm channels a quasi instantaneous switching between the tracking of the first analog input signal and the tracking of the second analog input signal is possible.

It should be noted that while first tracking algorithm channel 15 and second tracking algorithm channel 16 are depicted as separate units in the embodiment of FIG. 1, they may for example be implemented by programming a single processor accordingly, for example using multitasking for executing both tracking algorithms. In such a case, also the function of demultiplexer 13 and second multiplexer 14 may be implemented by corresponding programming. In other words, demultiplexer 13 and second multiplexer 14 need not be hardware multiplexers, but may also be software implemented multiplexers.

In still other embodiments, the same tracking algorithm may be used for tracking both the first analog input signal and the second analog input signal, but the digital output signals may be stored separately. An example for such an embodiment is shown in FIG. 3.

In the tracking ADC arrangement of FIG. 3, again signals associated with a first analog input signal are labeled U, and signals associated with a second analog input signal are labeled V. A first analog input signal and a second analog input signal are fed to a first multiplexer 30, and an output of first multiplexer 30 is coupled with a first input of a comparator 31. A second input of comparator 31 is coupled with an output of a digital-to-analog converter 32.

An output of comparator 31 is coupled with an input of a tracking algorithm 33. Tracking algorithm 33 adjusts a digital output signal depending on the result of a comparison performed by comparator 31. The digital output value is fed both to digital-to-analog converter 32 and to a demultiplexer 34. The outputs of demultiplexer 34 are coupled on the one hand with outputs of the tracking ADC arrangement of FIG. 3 for outputting first and second digital output signals and on the other hand with a first memory 36 and a second memory 37. First memory 36 and second memory 37 are additionally coupled with a second multiplexer 35. An output of second multiplexer 35 is coupled with an input of tracking algorithm 33.

Figure 3:
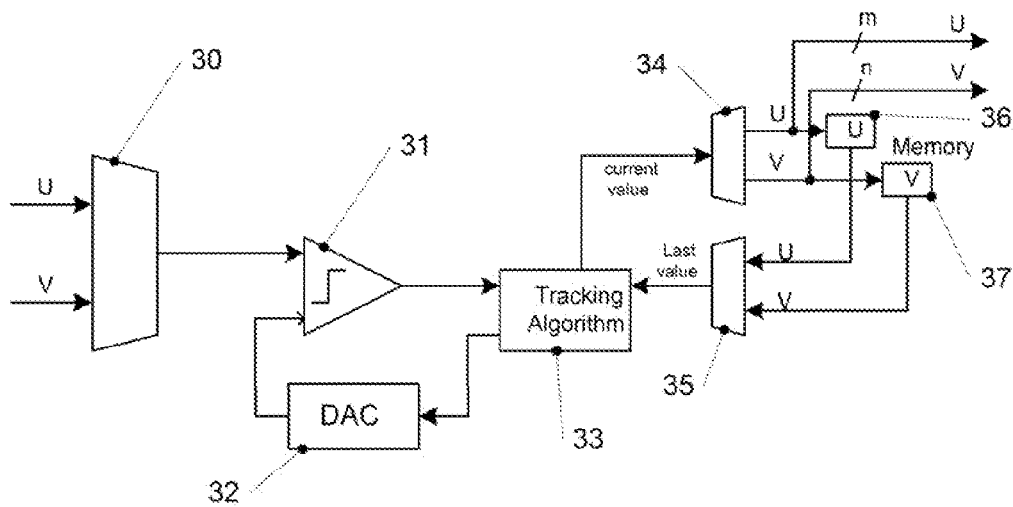
FIG. 3 shows a diagram of a tracking analog-to-digital converter arrangement according to a further embodiment.

The functioning of the embodiment of FIG. 3 is as follows:

Multiplexer 30 switches between supplying the first analog input signal and the second analog input signal to comparator 31. Demultiplexer 34 and second multiplexer 35 switch corresponding to the switching of first multiplexer 30 such that alternately the signal path relating to the first analog input signal (labeled U) and the signal path relating to the second analog input signal (labeled V) is active. When the signal path labeled U relating to the first analog input signal is active, tracking algorithm 33 retrieves a last digital output value from first memory 36 via second multiplexer 35, outputs this value to DAC 32 such that an analog version of this last value is compared with the current first analog input signal. Tracking algorithm 33 then adapts the last value according to the comparison, for example by increasing the digital value if the analog input signal is greater than the digital version of the last value or decreasing the digital value if the current first analog input signal is smaller than the digital version of the last value. This adapted digital value is then output as the current value and written to first memory 36 via demultiplexer 34.

Conversely, when first multiplexer 30, demultiplexer 34 and second multiplexer 35 are switched to the signal path labeled V related to the second analog input signal, a tracking corresponding to the one described above for the first analog input signal is performed now using the second analog input signal being fed to comparator 31 and the value stored in memory 37.

Therefore, tracking algorithm 33, first memory 36 and second memory 37 may be seen as portions of a tracking circuitry, wherein tracking algorithm 33 is associated both with a first analog input signal and a second analog input signal, while first memory 36 is associated only with the first analog input signal and second memory 37 is associated only with the second analog input signal.

In the embodiment of FIG. 3, through storing the digital values relating to the first analog input signal and the second analog input signal separately, in this case in first memory 36 and second memory 37, also in this case when switching from one analog input signal to the other analog input signal the tracking is essentially instantaneously switched from tracking the first analog input signal to tracking the second analog input signal and vice versa. Therefore, also in this case a tracking behavior e.g. as explained with reference to FIG. 2 may occur.

It should be noted that while in the embodiment of FIG. 3 a first memory 36 and a second memory 37 are depicted, these in some implementations may be formed by different memory regions, e.g. different parts of an address space, of a single memory arrangement. The functions of demultiplexer 34 and multiplexer 35 can then be implemented by addressing the memory arrangement accordingly. In still other embodiments, first memory 36 and second memory 37 may be internal memory portions or registers of a processor like a digital signal processor implementing tracking algorithm 33, and again the functions of demultiplexer 34 and second multiplexer 35 may be implemented by a corresponding addressing of this internal memory or the registers. In other words, any storage configured to separately store the two different digital output values for the two different signal paths may be used.

Figure 4:
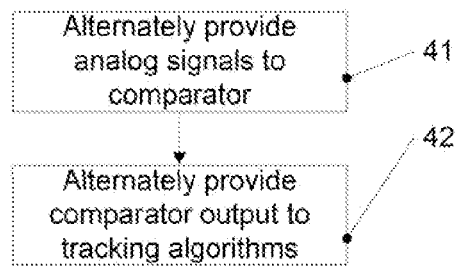
FIG. 4 shows a flow diagram illustrating a method according to an embodiment.

Turning now to FIG. 4, a method according to an embodiment is shown. The method depicted in FIG. 4 may be implemented in the arrangement shown in FIG. 1, but may also be implemented independent therefrom.

At 41, analog signals, for example two different analog input signals, are provided to a comparator. At 42, the comparator output is alternately provided to different tracking algorithms. The alternating of 41 and 42 may be performed synchronously.

Figure 5:
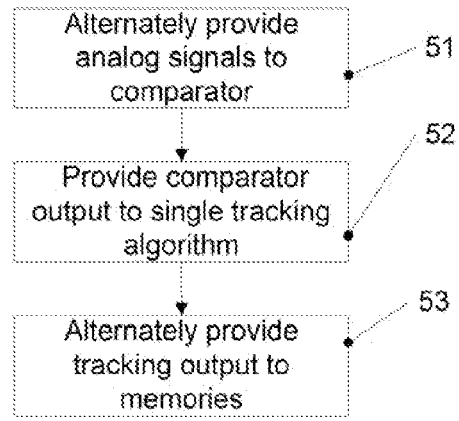
FIG. 5 shows a flow diagram illustrating a method according to another embodiment.

In FIG. 5, a flow diagram illustrating a method according to a further embodiment is shown. The method illustrated in FIG. 5 may for example be implemented in the arrangement of FIG. 3, but also may be used independently therefrom.

At 51, analog signals, for example two or more analog input signals, are alternately provided to a comparator.

At 52, a comparator output is provided to a single tracking algorithm. At 53, the output of the tracking algorithm is alternately provided to different memories, for example different memory portions of a single memory arrangement or also to physically separate memory arrangements.

Figure 6:
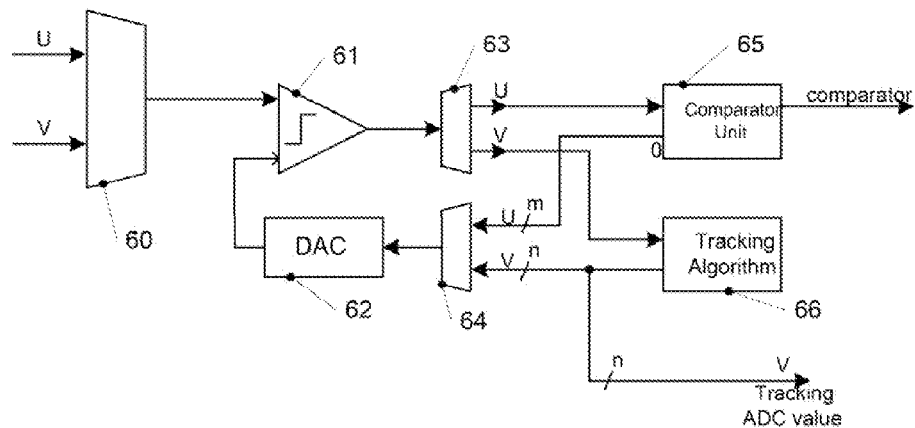
FIG. 6 shows a diagram of a tracking analog-to-digital converter arrangement according to another embodiment.

Turning now to FIG. 6, a further embodiment of a tracking ADC arrangement is shown. In the tracking ADC arrangement of FIG. 6, a comparator 61 on the one hand is used for the analog-to-digital conversion, i.e. the tracking, and additionally is used as a comparator for comparing an input signal with a predetermined value, for example zero, and outputting the result. In FIG. 6, signals associated with the comparison with a predetermined value are generally labeled U, while signals associated with analog-to-digital conversion are generally labeled V.

In the embodiment of FIG. 6, a first analog input signal which is to be compared to a predetermined value and a second analog input signal which is to be converted to a digital signal are fed to a first multiplexer 60. An output of first multiplexer 60 is coupled with a first input of a comparator 61. A second input of comparator 61 is coupled with an output of a digital-to-analog converter 62.

An output of comparator 61 is coupled with an input of a demultiplexer 63. Demultiplexer 63 alternately provides the output signal of comparator 61 either to a comparator unit 65 or to a tracking algorithm 66. An output of comparator unit 65 is output as comparator output of the arrangement of FIG. 6.

Comparator unit 65 comprises a further output outputting a constant digital m-bit value, for example a zero, and supplying this value to a first input of a second multiplexer 64. An output of tracking algorithm 66 is coupled with a digital output labeled "tracking ADC value" in FIG. 6 for outputting the converted digital version of the second analog input signal. This output of tracking algorithm 66 which may be a n-bit output, wherein n may be equal or unequal to m, is further coupled to a second input of second multiplexer 64. Second multiplexer 64 alternately feeds the constant digital output of comparator unit 65 and the output of tracking algorithm 66 to an input of digital-to-analog converter 62.

The functioning of the arrangement shown in FIG. 6 is as follows:

First multiplexer 60, demultiplexer 63 and second multiplexer 64 switch synchronously alternating between the respective inputs or outputs. In other words, alternately the signal path labeled U and the signal path labeled V are activated.

When the signal path labeled U, i.e. the signal path associated with the first analog input signal, is activated, the first analog input signal is compared with the analog version of the constant digital value output by comparator unit 65 (for example zero) in comparator 61, and the result is output. When first multiplexer 60, demultiplexer 63 and second multiplexer 64 are switched to the second signal path labeled V, comparator 61, tracking algorithm 66 and digital-to-analog converter 62 act as a tracking ADC for converting the second analog input signal to a corresponding digital output signal.

It should be noted that in some applications it may be desirable to compare the same signal to a fixed value and to convert this signal to a digital signal. In other words, in some applications the first analog input signal and the second analog input signal may be the same. In such application, first multiplexer 60 may be omitted. Furthermore, comparator unit 65 and tracking algorithm 66 may be implemented by programming a single processor like a digital signal processor or a multipurpose processor accordingly, and the multiplexing and demultiplexing function, for example of the multiplexer 63 and/or second multiplexer 64, may also be implemented by such programming.

Figure 7:
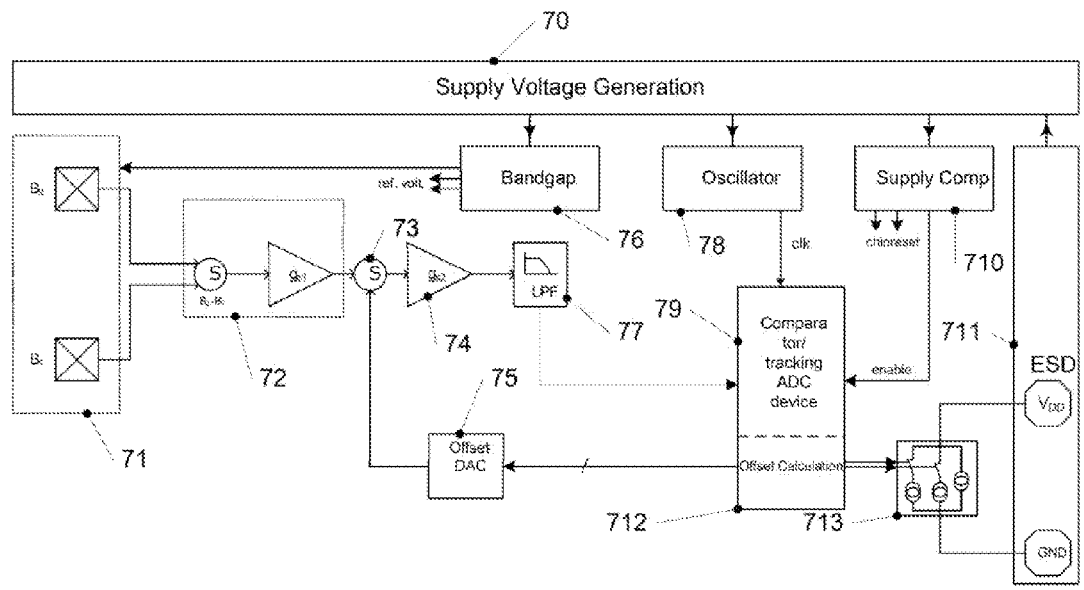
FIG. 7 shows a block diagram of a portion of a sensor arrangement according to an embodiment.

An arrangement like the one discussed with reference to FIG. 6 may for example be used in control circuitries for sensors like magnetic acceleration/speed sensors which for example are used in automotive applications. FIG. 7 shows an example for such an embodiment.

The sensor control circuit shown in FIG. 7 comprises a supply voltage generation circuit 70 to generate a supply voltage for the control circuit. Furthermore, the circuit comprises a band gap circuit 76 to generate a constant reference voltage, an oscillator 78 to generate a clock signal clk, a supply comparator 710 to monitor the supply voltage and an ESD (electrostatic discharge) protection circuit 711.

A sensor input 71 receives signals $B_1$ for example corresponding to a left sensor indication and $B_2$ corresponding to a right sensor indication and feeds these signals to a differential amplifier 72. As schematically depicted in FIG. 7, differential amplifier 72 amplifies a difference between signal $B_2$ and $B_1$ with an amplification factor $g_{s1}$.

The thus amplified signal is fed to a subtractor 3 where an offset the generation of which is described later is subtracted from the signal. The thus generated offset compensated signal is further amplified by a amplifier 74 with a gain of $g_{s2}$ and low pass filtered by a low pass filter 77. An output of low pass filter 77 is coupled with an input of a comparator/tracking ADC device 79, which device 79 is implemented together with an offset calculation 712. Comparator/tracking ADC device 79 may for example essentially be implemented as shown in FIG. 6. In this case, only one input signal is supplied for example to the arrangement of FIG. 6 such that first multiplexer 60 of FIG. 6 may be omitted, such that the output signal of low pass filter 77 alternately is converted to a digital signal and compared with a predetermined value, in this case zero to detect a zero crossing, by comparator/tracking ADC device 79. The switching between this comparing and tracking ADC conversion, for example the switching of demultiplexer 63 and second multiplexer 64 in FIG. 6, may be performed based on the clock signal received from oscillator 78. Based on the detection of zero crossing and the digital value generated by comparator/tracking ADC device 79, offset calculation 712 calculates an offset which is fed to an offset digital-to-analog converter 75, which generates an analog version of this offset to be fed to subtractor 73. Depending on a detection of a comparator unit of comparator/tracking ADC device 79, e.g. comparator unit 65 of FIG. 6, the current source 713 is switched on or off, generating a current-output protocol flowing between $V_{DD}$ and ground GND.

As in comparator/tracking ADC device the same comparator, for example comparator 61 of FIG. 6, is used for detecting the zero crossing and for the tracking ADC function, an offset of this comparator is cancelled out and essentially does not influence the calculated offset.

Figure 8:
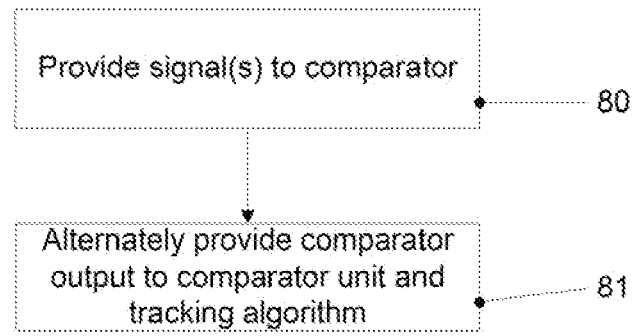
FIG. 8 shows a flow diagram of a method according to a further embodiment.

Turning now to FIG. 8, a method according to a further embodiment is schematically shown. The method illustrated in FIG. 8 may for example be implemented in the arrangement of FIG. 6, but is not limited thereto.

At 80, one or more signals are provided to a comparator, in case of more than one signal alternately.

At 81, the comparator output is provided alternately to a comparator unit and a tracking algorithm.

Figure 9:
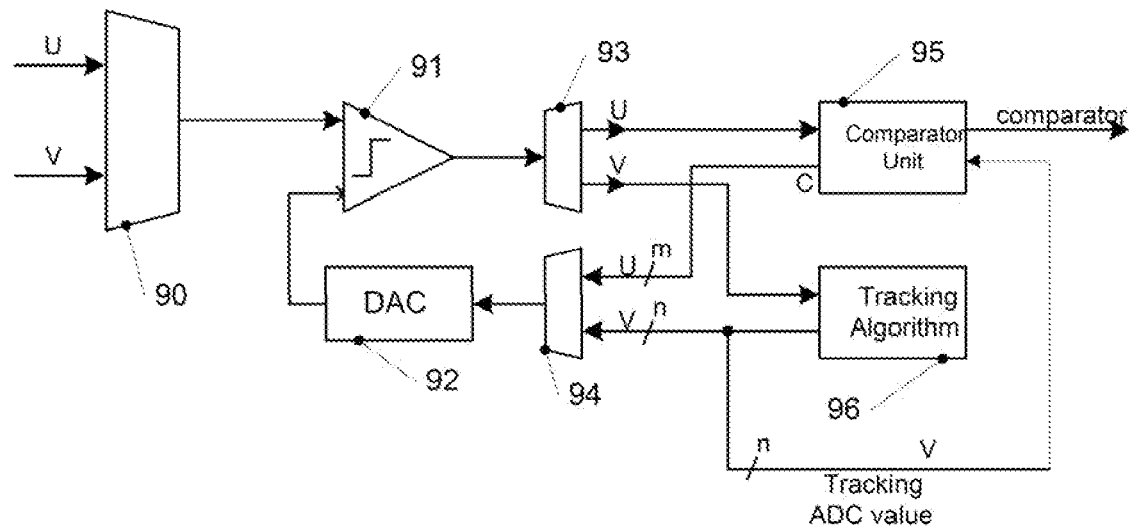
FIG. 9 shows a block diagram of a tracking analog-to-digital converter arrangement according to another embodiment.

A further embodiment of a tracking ADC arrangement is shown in FIG. 9. The embodiment of FIG. 9 is a variation of the embodiment of FIG. 6. Elements 90-94 and 96 of the embodiment of FIG. 9 correspond to elements 60-64 and 66, respectively, of the embodiment of FIG. 6 and will therefore not be described again in detail. In contrast to comparator unit 65 of the embodiment of FIG. 6 which is configured to output a constant value, e.g. zero, a comparator unit 95 of FIG. 9 is configured to output a variable comparator value C. This varying value might be a function of the tracking ADC value which comparator unit 95 receives in FIG. 9. In an application, the variable comparator value might be a function of the tracking ADC value. If, for example, the analog input signal is a sinusoidal waveform, then the variable comparator value might be set to, for example, 70% of the peak-peak amplitude of the sine wave. In some embodiments, such a percentage value may be variable and may e.g. depend on a peak-peak amplitude of the sine wave. Such an embodiment may for example be used if the first analog input signal and the second analog input signal may be the same.

It is to be emphasized that the above-described embodiments serve merely as examples, and a plurality of modifications and variations are possible without departing from the scope of the present invention. Some modifications and alternatives have already been discussed above, some more will be described below.

While in the embodiments described with reference to FIGS. 1-5 two analog input signals are alternately supplied to a comparator to be converted to digital signals, in other embodiments three or more signals may be used. In such a case, for example in the embodiments of FIGS. 1 and 3 multiplexers with a corresponding greater number of inputs and demultiplexers with a corresponding greater number of outputs may be used, and in the embodiment of FIG. 1 a corresponding number of tracking algorithms and in the embodiment of FIG. 3 a corresponding number of memories may be used. Likewise, the embodiment of FIGS. 1 and 3 may be combined, for example to provide a conversion for altogether four analog input signals for example with two different tracking algorithms, each accessing two different memories or memory portions.

Also, the embodiments of FIGS. 1 and 3 on the one hand and FIG. 6 on the other hand may be combined. For example, by using corresponding multiplexers more than one tracking algorithm or more than one memory may be provided to be able to convert more than one analog input signal to a digital output signal in a parallel manner and with the same arrangement an input signal may be compared with a fixed or variable value.

While in the embodiment of FIG. 6 and at 81 of FIG. 8 an output signal of a comparator is provided to a comparator unit, in other embodiments the comparator unit may be omitted and the corresponding output signal may be directly provided to a comparator output of the arrangement. In case of FIG. 6, for example only a unit may be provided just to provide a constant value, for example zero, to second multiplexer 64. In other embodiments, comparator unit 65 may comprise circuitry and/or algorithms to modify the output received from demultiplexer 63. For example, comparator unit 65 may comprise a hysteresis algorithm to provide a hysteresis behavior to the comparator output signal of the arrangement (the signal being labeled "comparator" in FIG. 6).

The various acts or operations described with reference to FIGS. 4, 5 and/or 8 need not necessarily be performed in the described order. In particular, various operations may be performed in a parallel manner, for example essentially at the same time by different portions of an apparatus implementing the method.

While in the embodiments described above tracking algorithms are used for analog-to-digital conversion, in other embodiments other types of analog-to-digital conversion algorithms may be used, and correspondingly instead of tracking circuitry other types of analog-to-digital conversion circuitry may be used. For example, in a further embodiment the so called approach of the "successive approximation (SAR-ADC)" or a similar algorithm can be used.

As can be seen, a plurality of variants or modifications are possible, and therefore the scope of the present invention is not to be limited by the above-described embodiments.

What is claimed is:

1. An apparatus, comprising:
a first analog input,
a second analog input,
a comparator, a first input of said comparator being coupled with said first analog input and said second analog input,
a multiplexer, a first input of said multiplexer being coupled with said first analog signal input, a second input of said multiplexer being coupled with said second analog signal input and an output of said multiplexer being coupled with said first input of said comparator,
analog-to-digital conversion circuitry coupled with an output of said comparator and a second input of said comparator,
wherein a first portion of said analog-to-digital conversion circuitry associated with converting a signal applied to said first analog input is implemented at least partially separate from a second portion of said analog-to-digital conversion circuitry associated with converting a signal applied to said second analog input.

2. The apparatus of claim 1, wherein said first portion comprises a first analog-to-digital conversion algorithm channel, and said second portion comprises a second analog-to-digital conversion algorithm channel separate from said first analog-to-digital conversion algorithm channel.

3. The apparatus of claim 2, further comprising a demultiplexer, wherein an input of said demultiplexer is coupled with said output of said comparator, a first output of said demultiplexer is coupled with said first analog-to-digital conversion algorithm channel and a second output of said demultiplexer is coupled with said second analog-to-digital conversion algorithm channel .

4. The apparatus of claim 1, wherein said first and second portion comprise a common analog-to-digital conversion algorithm,
wherein said first portion comprises a first memory portion to store values associated with the conversion of said first signal and said second portion comprises a second memory portion different from said first memory portion to store a value associated with the conversion of said second signal.

5. The apparatus of claim 4, further comprising a demultiplexer, wherein an input of said demultiplexer is coupled with an output of said analog-to-digital conversion algorithm, wherein a first output of said demultiplexer is coupled with said first memory portion and a second output of said demultiplexer is coupled with said second memory portion.

6. The apparatus of claim 1, wherein said analog-to-digital conversion circuitry comprises a tracking circuitry.

7. An apparatus, comprising:
a comparator,
a demultiplexer, an input of said demultiplexer being coupled with an output of said comparator,
at least one analog signal input, said at least one analog signal input being coupled with a first input of said comparator, and
a digital-to-analog converter, an output of said digital-to-analog converter being coupled with a second input of said comparator.

8. The apparatus of claim 7, further comprising a first analog-to-digital conversion algorithm channel coupled to a first output of said demultiplexer, and a second analog-to-digital conversion algorithm channel coupled to a second output of said demultiplexer.

9. The apparatus of claim 8, wherein said at least one analog signal input comprises a first analog input signal and a second analog input signal, the apparatus further comprising:
a first multiplexer, a first input of said first multiplexer being coupled to said first analog signal input, a second input of said first multiplexer being coupled to said second analog signal input, and an output of said first multiplexer being coupled to said first input of said comparator, and
a second multiplexer, a first input of said second multiplexer being coupled with said first analog-to-digital conversion algorithm channel, a second input of said second multiplexer being coupled to said second analog-to-digital conversion algorithm channel, and an output of said second multiplexer being coupled to an input of said digital-to-analog converter.

10. The apparatus of claim 9, wherein said first multiplexer, said second multiplexer and said demultiplexer are configured to be switched synchronously.

11. The apparatus of claim 7, wherein a first output of said demultiplexer is coupled with a comparator output of said apparatus, and wherein a second output of said demultiplexer is coupled with a analog-to-digital conversion algorithm.

12. The apparatus of claim 11, further comprising offset calculation circuitry coupled to said comparator signal output and to an output of said analog-to-digital conversion algorithm.

13. The apparatus of claim 11, further comprising a multiplexer and a digital value generator configured to generate a digital value,
wherein an output of said digital value generator is coupled with a first input of said multiplexer,
wherein an output of said analog-to-digital conversion algorithm is coupled with a second input of said multiplexer, and
wherein an output of said multiplexer is coupled with an input of said digital-to-analog converter.

14. The apparatus of claim 13, wherein said digital value generator is configured to generate said digital value based on an output of said analog-to-digital conversion algorithm.

15. The apparatus of claim 13, wherein said digital value generator is configured to generate a constant digital value.

16. A method, comprising:
alternately providing analog signals to a comparator,
providing a comparator output to a analog-to-digital conversion circuitry comprising a first portion associated with the conversion of a first one of said analog signals and a second portion associated with the conversion of a second one of said analog signals, wherein said first and second portions are at least partially implemented separately.

17. The method of claim 16, wherein said alternately providing the comparator output comprising alternately providing the comparator output to a first analog-to-digital conversion algorithm channel of said first portion and a second analog-to-digital conversion algorithm channel of said second portion.

18. The method of claim 16, wherein said alternately providing the comparator output comprises alternately providing said comparator output to a analog-to-digital conversion algorithm common to said first portion and said second portion, said method further comprising:
   alternately providing an output of said analog-to-digital conversion algorithm to a first memory portion of said first portion and a second memory portion of said second portion.

19. The method of claim 16, further comprising:
providing a analog version of an output of said analog-to-digital conversion algorithm circuitry to said comparator.

20. An apparatus, comprising:
a first analog signal input,
a second analog signal input,
a multiplexer, a first input of said multiplexer being coupled with said first analog signal input and a second input of said multiplexer being coupled with said second analog signal input,
a comparator, a first input of said comparator being coupled with an output of said multiplexer,
a analog-to-digital conversion algorithm, an input of said analog-to-digital conversion algorithm being coupled with an output of said comparator,
a digital-to-analog converter, an input of said digital-to-analog converter being coupled with an output of said analog-to-digital conversion algorithm and an output of said analog-to-digital conversion algorithm being coupled to a second input of said comparator,
a first memory portion coupled with said analog-to-digital conversion algorithm, said first memory portion being configured to store an output value of said analog-to-digital conversion algorithm related to an analog-to-digital conversion of a signal applied to said first signal input, and
a second memory portion different from said first memory portion, said second memory portion being configured to store an output value of said analog-to-digital conversion algorithm related to an analog-to-digital conversion of a signal applied to said second signal input.

21. The apparatus of claim 20, further comprising a demultiplexer, an input of said demultiplexer being coupled with an output of said analog-to-digital conversion algorithm, a first output of said demultiplexer being coupled with said first memory portion and a second output of said demultiplexer being coupled with said second memory portion, and
   a further multiplexer, a first input of said further multiplexer being coupled with said first memory portion, a second input of said further multiplexer being coupled with said second memory portion and an output of said second multiplexer being coupled with a further input of said analog-to-digital conversion algorithm.

22. The apparatus of claim 21, wherein said multiplexer, said further multiplexer and said demultiplexer are configured to be switched synchronously.

* * * * *